(12) United States Patent
Sung

(10) Patent No.: US 8,605,519 B2
(45) Date of Patent: Dec. 10, 2013

(54) PUMP CIRCUIT AND SEMICONDUCTOR MEMORY DEVICE INCLUDING THE SAME

(75) Inventor: Moon Soo Sung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 60 days.

(21) Appl. No.: 13/310,416

(22) Filed: Dec. 2, 2011

(65) Prior Publication Data

US 2012/0140563 A1 Jun. 7, 2012

(30) Foreign Application Priority Data

Dec. 3, 2010 (KR) ........................ 10-2010-0122921

(51) Int. Cl.
*G11C 5/14* (2006.01)

(52) U.S. Cl.
CPC ...................................... *G11C 5/147* (2013.01)
USPC ................. 365/189.09; 365/233.11; 365/226; 365/233.12; 365/189.07; 365/185.17

(58) Field of Classification Search
CPC ................................ G11C 5/145; G11C 16/30
USPC .................. 365/189.09, 233.11, 226, 233.12, 365/189.07, 185.17
See application file for complete search history.

(56) References Cited

U.S. PATENT DOCUMENTS

| 6,567,309 B2 * | 5/2003 | Tanzawa ................... 365/185.18 |
| 2008/0036528 A1 * | 2/2008 | Chen et al. ..................... 327/536 |

FOREIGN PATENT DOCUMENTS

| KR | 1020000027560 | 5/2000 |
| KR | 100781041 | 11/2007 |
| KR | 100809072 | 3/2008 |
| KR | 1020100054484 | 5/2010 |
| KR | 1020100115113 | 10/2010 |

OTHER PUBLICATIONS

Office Action issued by the Korean intellectual Property Office on Oct. 29, 2012.

* cited by examiner

*Primary Examiner* — Thong Q Le
(74) *Attorney, Agent, or Firm* — IP & T Group LLP

(57) ABSTRACT

A pump circuit includes a plurality of clock control circuits configured to transfer a clock to respective output terminals in response to respective pump-off signals or block the clock from being transferred to the respective output terminals, a plurality of charge pumps configured to generate respective high voltages by performing respective pumping operations in response to respective clock signals of the output terminals, and a plurality of switching circuits configured to transfer the respective high voltages to a final output terminal in response to respective control signals.

20 Claims, 4 Drawing Sheets

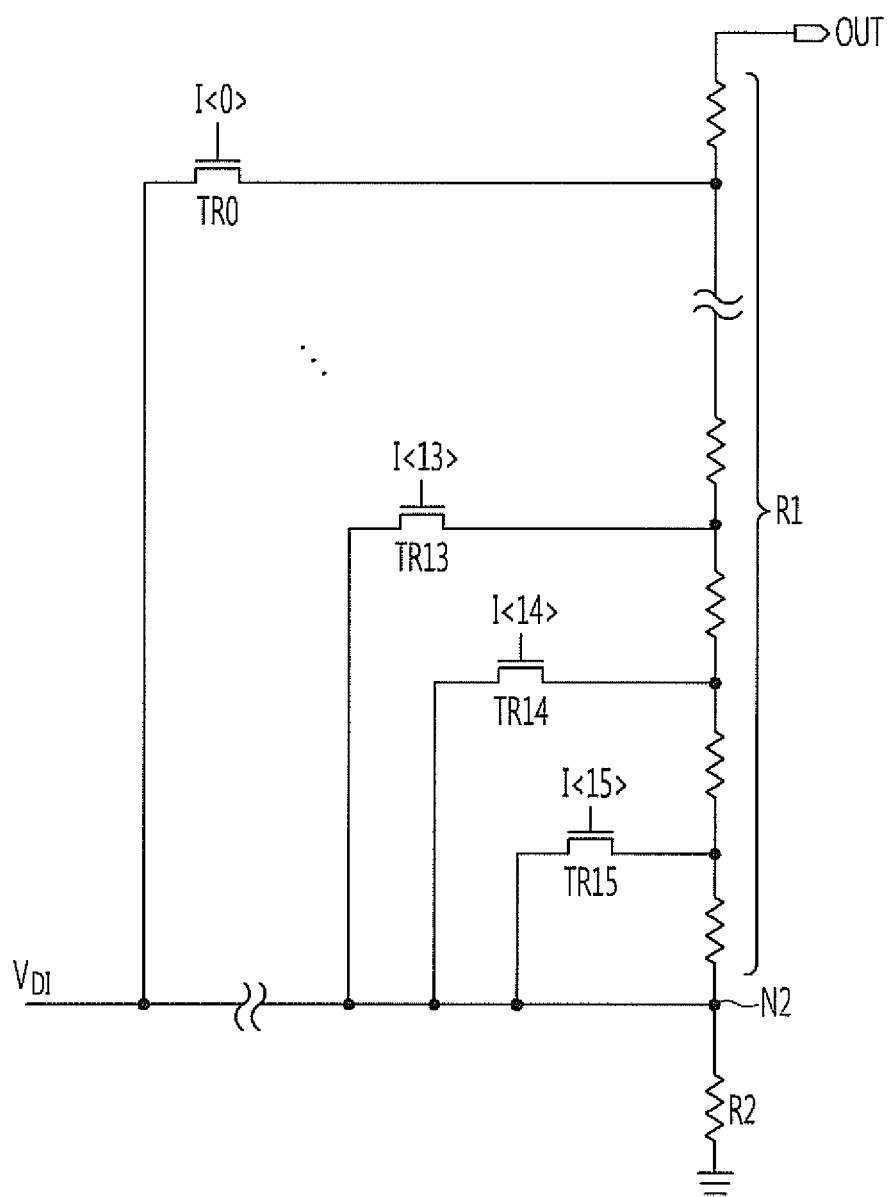

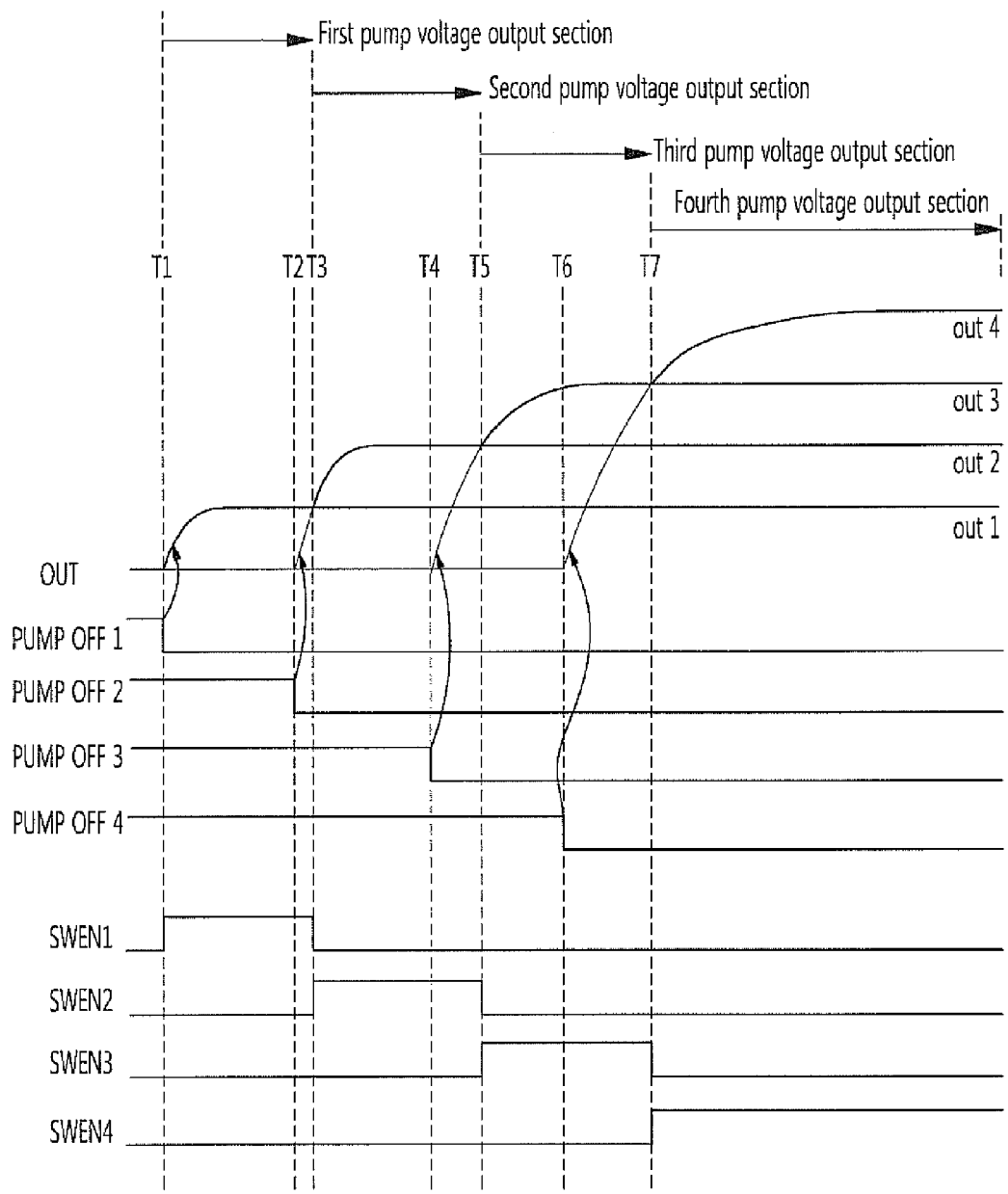

PUMP CIRCUIT AND SEMICONDUCTOR MEMORY DEVICE INCLUDING THE SAME

CROSS-REFERENCE TO RELATED APPLICATION

Priority to Korean patent application number 10-2010-0122921 filed on Dec. 3, 2010, the entire disclosure of which is incorporated by reference herein, is claimed.

BACKGROUND

Exemplary embodiments relate to a pump circuit and a semiconductor memory device including the same and, more particularly, to a pump circuit for reducing power consumption by optimizing the operation thereof and a semiconductor memory device including the same.

A non-volatile memory device includes a memory cell array for storing data and operation control circuits for controlling an operation of storing data in the memory cell array or reading data stored in the memory cell array. The operation control circuits includes a control circuit for outputting various control signals, a voltage supply circuit for supplying voltages for a program, read, or erase operation in response to the output signals of the control circuit, an X decoder for selecting one of a plurality of cell blocks of the memory cell array and transferring the voltages of the voltage supply circuit to the selected cell block, a Y decoder for selecting a column in response to the output signals of the control circuit, and a page buffer group.

Among them, the voltage supply circuit supplies the X decoder with the voltages for the program, read, or erase operation. In particular, the voltage supply circuit includes a pump circuit for generating high voltage of 15 V to 30 V because the high voltage is to be supplied in the program operation.

The pump circuit includes a plurality of charge pumps. The charge pumps are operated to output one output voltage. Therefore, even when generating a low voltage, all the charge pumps may operate to increase current consumption excessively.

BRIEF SUMMARY

Exemplary embodiments relate to reducing current consumption by selectively driving charge pumps depending on a level of voltage to be output from a pump circuit.

A pump circuit according to an aspect of the present disclosure includes a plurality of clock control circuits configured to transfer a clock to respective output terminals in response to respective pump-off signals or block the clock from being transferred to the respective output terminals, a plurality of charge pumps configured to generate respective high voltages by performing respective pumping operations in response to respective clock signals of the output terminals, and a plurality of switching circuits configured to transfer the respective high voltages to a final output terminal in response to respective control signals A semiconductor memory device according to another aspect of the present disclosure includes a memory cell array configured to store data, a plurality of clock control circuits configured to output respective clocks to respective output terminals in response to respective pump-off signals, a plurality of high voltage generators configured to generate respective high voltages in response to the respective clocks, a plurality of switching circuits configured to transfer the respective high voltages to a final output terminal in response to respective control signals, a row decoder configured to transfer the high voltages, transferred to the final output terminal, to the memory cell array, and a control circuit configured to output the pump-off signals. The pump-off signals are activated in response to a set high voltage level.

A pump circuit according to yet another aspect of the present disclosure includes a plurality of high voltage generation circuits configured to generate respective high voltages by performing respective pumping operations in response to a clock and a plurality of switching circuits configured to transfer the respective high voltages to an output terminal in response to respective control signals. Each of the high voltage generation circuits comprises a clock control circuit for transferring the clock to the high voltage generation circuit in response to a pump-off signal or for blocking the clock from being supplied to the high voltage generation circuit.

BRIEF DESCRIPTION OF THE DRAWINGS

FIG. 3 is a detailed circuit diagram of a division circuit shown in FIG. 2; and

FIG. 4 is a timing diagram illustrating a method of driving the pump circuit of FIG. 2.

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1:
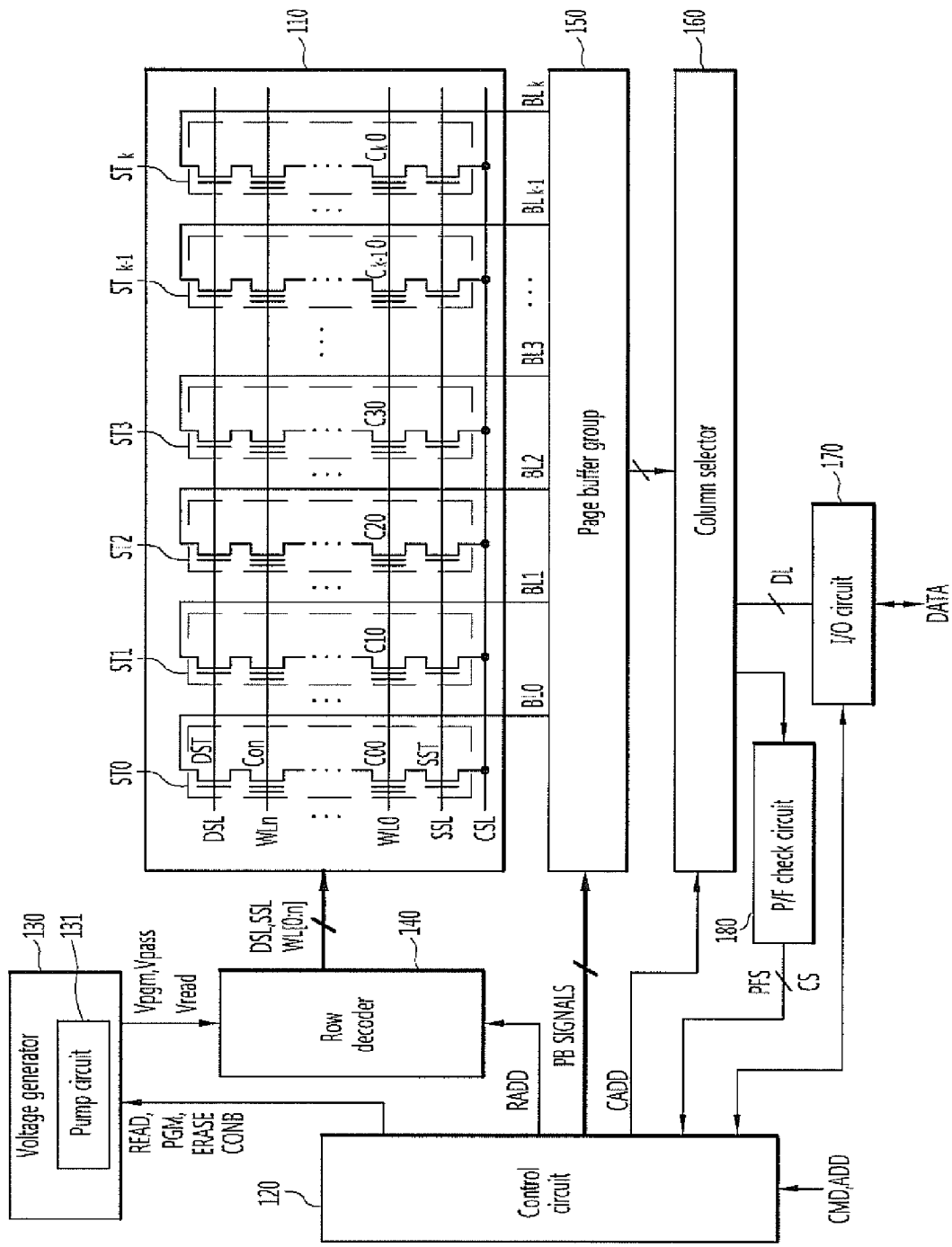
FIG. 1 is a block illustrating a semiconductor memory device according to an exemplary embodiment of this disclosure.

FIG. 1 is a block illustrating a semiconductor memory device according to an exemplary embodiment of this disclosure.

Referring to FIG. 1, the semiconductor memory device according to the exemplary embodiment of this disclosure includes a memory cell array 110, an operation circuit group (130, 140, 150, 160, 170, and 180) configured to perform a program operation or a read operation for the memory cells of the memory cell array 110, and a control circuit 120 configured to control the operation circuit group (130, 140, 150, 160, 170, and 180).

Here, the nonvolatile memory device may be a NAND flash memory device. Further, the operation circuit group may include a voltage generator 130, a row decoder 140, a page buffer group 150, a column selector 160, an I/O circuit 170, and a Pass/Fail (P/F) check circuit 180.

The memory cell array 110 includes the plurality of memory blocks. As an example, only one of the memory blocks is shown in FIG. 1. The memory block includes a plurality of strings ST0 to $ST_k$. Some of the strings ST0 to $ST_k$ are designated as normal strings, and some of the strings are designated as flag strings. The strings have the same configuration. Each (for example, ST0) of the strings includes a source select transistor SST coupled to a common source line CSL, a plurality of memory cells C00 to C0n, and a drain select transistor DST coupled to a bit line BL0.

Cells included in the flag string are called flag cells, but have the same configuration as the memory cells.

The gate of the source select transistor SST is coupled to a source select line SSL. The gates of the memory cells C00 to C0n are coupled to respective word lines WL0 to WLn. The gate of the drain select transistor DST is coupled to a drain select line DSL. The strings ST0 to $ST_k$ are coupled to respective bit lines BL0 to $BL_k$ and are in common coupled to the common source line CSL.

The control circuit 120 internally generates a program operation signal PGM, a read operation signal READ, or an erase operation signal ERASE in response to a command signal CMD and also generates a control bit CONB depending on a voltage to be supplied for an internal operation. The control circuit 120 generates control signals PB SIGNALS for controlling the page buffers (not shown) of the page buffer group 150 depending on a type of the internal operation.

Furthermore, the control circuit 120 internally generates a row address signal RADD and a column address signal CADD in response to an address signal ADD. Furthermore, the control circuit 120 checks whether each of the threshold voltages of selected memory cells has risen up to a minimum threshold voltage in response to the check signal CS of the P/F check circuit 180 in a program verification operation and determines whether to perform or finish a program operation depending on a result of the check.

The voltage supply circuit (130 and 140) generates operation voltages for the program operation, the erase operation, or the read operation of memory cells in response to the signals READ, PGM, ERASE, RADD, and CONB of the control circuit 120 and supplies the operating voltages to the drain select line DSL, the word lines WL0 to WLn, and the source select line SSL of a selected memory block. The voltage supply circuit includes the voltage generator 130 and the row decoder 140.

The voltage generator 130 outputs the operation voltages for the program, read, or erase operation of memory cells to global lines in response to the operation signals PGM, READ, and ERASE (that is, the internal command signals of the control circuit 120) and the control bit CONB (that is, a signal for generating the operation voltages). For example, the voltage generator 130 outputs operation voltages Vpgm, Vpass, and Vread to the global lines.

The row decoder 140 transfers the operation voltages of the voltage generator 130 to the strings ST0 to $ST_k$ of a selected one of the memory blocks, included in the memory cell array 110, in response to the row address signals RADD of the control circuit 120. In other words, the operation voltages are supplied to the local lines DSL, WL[0:n], and SSL of the selected memory block.

The page buffer group 150 includes the page buffers (not shown) coupled to the respective bit lines BL0 to $BL_k$. The page buffer group 150 supplies voltages used to store data in the memory cells C00 to Ck0 to the bit lines BL0 to $BL_k$ in response to the control signals PB SIGNALS of the control circuit 120.

More particularly, the page buffer group 150 precharges the bit lines BL0 to $BL_k$ or latches data corresponding to the threshold voltages of the memory cells C00 to Ck0 during the program operation, the erase operation, or the read operation for the memory cells C00 to Ck0. The data may be detected based on a shift in the voltages of the bit lines BL0 to $BL_k$, In other words, the page buffer group 150 controls the voltages of the bit lines BL0 to $BL_k$ based on data stored in the memory cells C00 to Ck0 and detects data stored in the memory cells C00 to Ck0.

The column selector 160 selects the page buffers of the page buffer group 150 in response to the column address signal CADD of the control circuit 120. Data latched in a page buffer selected by the column selector 160 is outputted.

The I/O circuit 170 transfers external data to the column selector 160 under the control of the control circuit 120 in order to input the external data to the page buffer group 150 during the program operation. When the external data is sequentially transferred to the page buffers of the page buffer group 150 by the column selector 160, the page buffers store the received data in their internal latches. Furthermore, in the read operation, the I/O circuit 170 externally outputs data received from the page buffers of the page buffer group 150 via the column selector 160.

The P/F check circuit 180 checks whether an error cell having a threshold voltage lower than a target voltage exists in memory cells programmed in the program operation, in the program verification operation and outputs a result of the check in the form of a check signal PFS. Furthermore, the P/F check circuit 180 counts the number of error cells and outputs a result of the count in the form of a check signal CS.

The control circuit 120 controls the level of a program voltage supplied to a selected word line during a program operation for memory cells coupled to the selected word line and controls the voltage generator 130 so that verification voltages can be selectively supplied to the selected word line during a program verification operation. In some embodiments, the control circuit 120 may control the voltage generator 130 in response to the check signal CS of the P/F check circuit 180.

In particular, among the circuits, the voltage generator 130 includes a pump circuit 131 for generating voltages of various levels, such as the program voltage and the read voltage. The pump circuit 131 is described in detail below.

Figure 2:
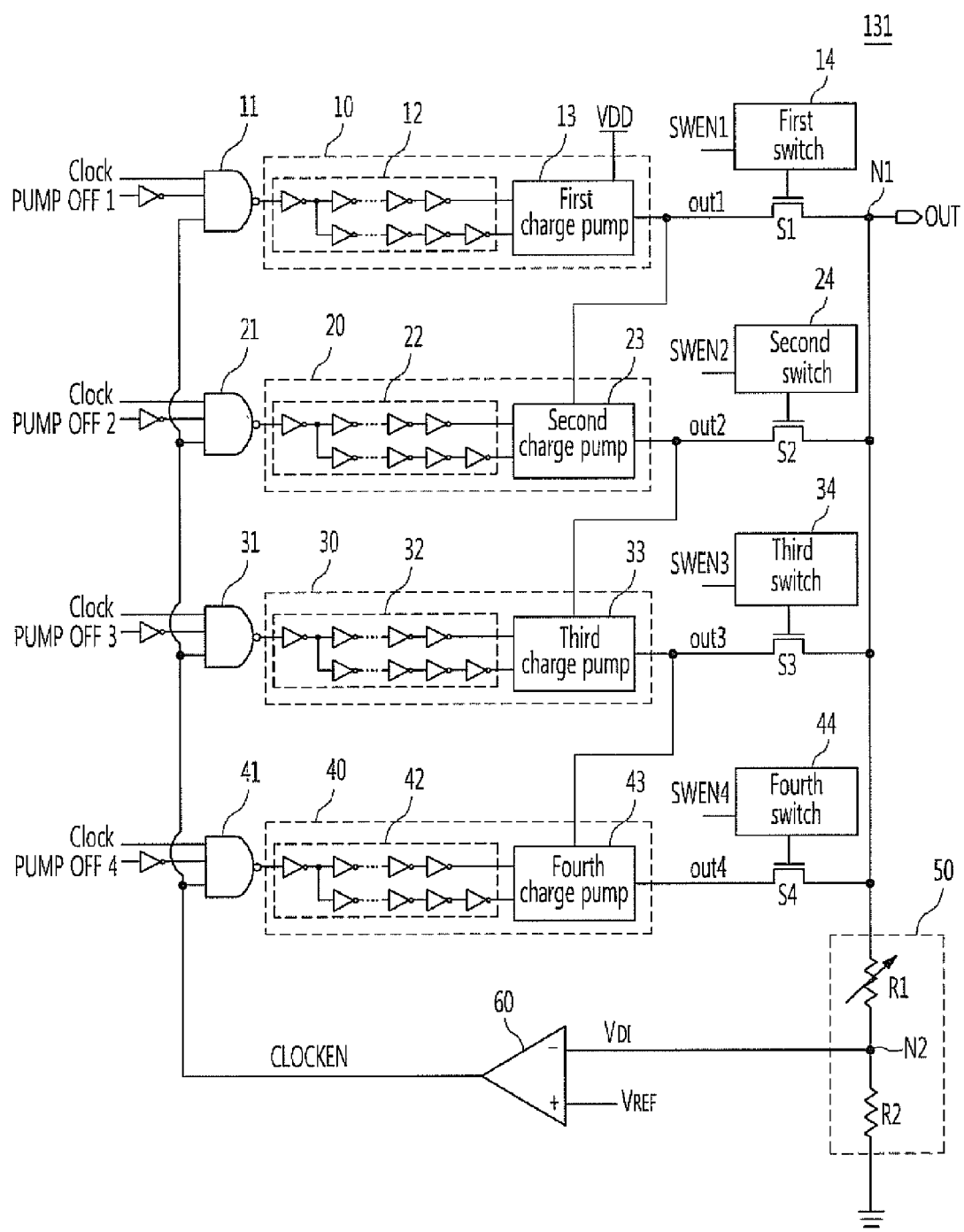
FIG. 2 is a detailed circuit diagram of a pump circuit shown in FIG. 1.

FIG. 2 is a detailed circuit diagram of the pump circuit 131 shown in FIG. 1.

The pump circuit 131 includes a plurality of clock control circuits 11, 21, 31, and 41, a plurality of high voltage generation circuits 10, 20, 30, and 40, and a plurality of switching circuits S1, S2, S3, and S4 for transferring the output signals of the respective high voltage generation circuits to the output terminal N1 of the pump circuit 131. In the present embodiment, the pump circuit 131 is illustrated to include only the four high voltage generation circuits 10, 20, 30, and 40, for the purpose of description.

The pump circuit 131 includes the clock control circuits 11 to 41 operated in response to respective clocks Clock, respective pump-off signals PUMP OFF1 to PUMP OFF4, and a clock enable signal CLOCLEN, the first to fourth high voltage generation circuits 10, 20, 30, and 40, the first to fourth switching circuits S1 to S4 coupled to the respective output terminals of the first to fourth high voltage generation circuits 10, 20, 30, and 40 and configured to transfer the respective voltages of the first to fourth high voltage generation circuits 10, 20, 30, and 40 to the output terminal N1 of the pump circuit 131, first to fourth switches 14, 24, 34, and 44 configured to supply respective turn-on or turn-off voltages to the first to fourth switching circuits S1 to S4, a division circuit 50 configured to divide voltage supplied to the output terminal N1 of the pump circuit 131 and output division voltage $V_{DI}$, and a comparison circuit 60 configured to output the clock enable signal CLOCKEN to the first to fourth high voltage generation circuits 10, 20, 30, and 40 in response to the division voltage $V_{DI}$ outputted from the division circuit 50.

The clock signal Clock is generated by an oscillator (not shown).

The first clock control circuit 11 blocks or transfers a clock signal in response the clock Clock, an inverted signal of the first pump-off signal PUMP OFF1, and the clock enable signal CLOCLEN. The first high voltage generation circuit 10 includes a first clock driver 12 configured to transfer the clock signal of the first clock control circuit 11, a stage having a diode and a capacitor paired, and a first charge pump 13 configured to output a first output voltage out1 by raising the level of an internal voltage VDD in response to the clock signal of the first clock driver 12. The first clock control circuit 11 may be formed of a NAND gate.

The first clock control circuit 11 outputs the clock signal of a low only when all input signals are high and outputs the clock signal of a high in other cases. Accordingly, the first clock control circuit 11 continues to output the clock signal of a high irrespective of the clock Clock and the clock enable signal CLOCKEN while the first pump-off signal PUMP OFF1 is high, because the inverted first pump-off signal PUMP OFF1 is low. Accordingly, the first charge pump 13 does not perform a pumping operation because the first clock driver 12 does not generate signals changed in response to the clock Clock.

Accordingly, in order for the first high voltage generation circuit 10 to perform the pumping operation, the clock Clock is to be supplied in the state that the first pump-off signal PUMP OFF1 remains low and the clock enable signal CLOCKEN remains high. In other words, the first clock control circuit 11 performs a masking circuit operation.

The second clock control circuit 21 blocks or transfer the clock signal in response to the clock Clock, an inverted signal of the second pump-off signal PUMP OFF2, and the clock enable signal CLOCLEN. The second high voltage generation circuit 20 includes a second clock driver 22 configured to transfer the clock signal of the second clock control circuit 21, a stage having a diode and a capacitor paired, and a second charge pump 23 configured to output a second output voltage out2 by raising the level of the internal voltage VDD in response to the clock signal of the second clock driver 22. The second clock control circuit 21 may be formed of a NAND gate.

The second clock control circuit 21 outputs the clock signal of a low only when all input signals are high and outputs the clock signal of a high in other cases. Accordingly, the second clock control circuit 21 continues to output a signal of a high irrespective of the clock signal Clock and the clock enable signal CLOCKEN while the second pump-off signal PUMP OFF2 is high, because the inverted second pump-off signal PUMP OFF2 is low. Accordingly, the second charge pump 23 does not perform a pumping operation because the second clock driver 22 does not generate signals changed in response to the clock Clock.

Accordingly, in order for the second high voltage generation circuit 20 to perform the pumping operation, the clock Clock is to be supplied in the state that the second pump-off signal PUMP OFF2 remains low and the clock enable signal CLOCKEN remains high. In other words, the second clock control circuit 21 performs a masking circuit operation.

The third clock control circuit 31 blocks or transfers the clock signal in response to the clock Clock, an inverted signal of the third pump-off signal PUMP OFF3, and the clock enable signal CLOCLEN. The third high voltage generation circuit 30 includes a third clock driver 32 configured to transfer the clock signal of the third clock control circuit 31, a stage having a diode and a capacitor paired, and a third charge pump 33 configured to output a third output voltage out3 by raising the level of the internal voltage VDD in response to the clock signal of the third clock driver 32. The third clock control circuit 31 may be formed of a NAND gate.

The third clock control circuit 31 outputs the clock signal of a low only when all input signals are high and outputs the clock signal of a high in other cases. Accordingly, the third clock control circuit 31 continues to output a signal of a high irrespective of the clock Clock and the clock enable signal CLOCKEN while the third pump-off signal PUMP OFF3 is high, because the inverted third pump-off signal PUMP OFF3 is low.

Accordingly, the third charge pump 33 does not perform a pumping operation because the third clock driver 32 does not generate signals changed in response to the clock Clock. Accordingly, in order for the third high voltage generation circuit 30 to perform a pumping operation, the clock Clock is to be supplied in the state that the third pump-off signal PUMP OFF3 remains low and the clock enable signal CLOCKEN remains high. In other words, the third clock control circuit 31 performs a masking circuit operation.

The fourth clock control circuit 41 blocks or transfers the clock signal in response to the clock Clock, an inverted signal of the fourth pump-off signal PUMP OFF4, and the clock enable signal CLOCLEN. The fourth high voltage generation circuit 40 includes a fourth clock driver 42 configured to transfer the clock signal of the fourth clock control circuit 41, a stage having a diode and a capacitor paired, and a fourth charge pump 43 configured to output a fourth output voltage out4 by raising the level of the internal voltage VDD in response to the clock signal of the fourth clock driver 42. The fourth clock control circuit 41 may be formed of a NAND gate.

The fourth clock control circuit 41 outputs the clock signal of a low only when all input signals are high and outputs the clock signal of a high in other cases. Accordingly, the fourth NAND gate 41 continues to output the clock signal of a high irrespective of the clock Clock and the clock enable signal CLOCKEN while the fourth pump-off signal PUMP OFF4 is high, because the inverted fourth pump-off signal PUMP OFF4 is low.

Accordingly, the fourth charge pump 43 does not perform a pumping operation because the fourth clock driver 42 does not generate signals changed in response to the clock Clock. Accordingly, in order for the fourth high voltage generation circuit 40 to perform the pumping operation, the clock Clock is to be supplied in the state that the fourth pump-off signal PUMP OFF4 remains low and the clock enable signal CLOCKEN remains high. In other words, the fourth clock control circuit 41 performs a masking circuit operation.

The first switch 14 outputs the turn-on voltage or the turn-off voltage of a high voltage in response to a first switch enable signal SWEN1. The first switching circuit S1 is formed of an NMOS transistor for transferring the first output voltage out1 to the output terminal N1 of the pump circuit 131 in response to the turn-on voltage of the first switch 14 or for blocking a voltage transfer between a node to which the first output voltage out1 is supplied and the output terminal N1 of the pump circuit 131 in response to the turn-off voltage.

The second switch 24 outputs the turn-on voltage or the turn-off voltage of a high voltage in response to a second switch enable signal SWNE2. The second switching circuit S2 is formed of an NMOS transistor for transferring the second output voltage out2 to the output terminal N1 of the pump circuit 131 in response to the turn-on voltage of the second switch 24 or for blocking a voltage transfer between a node to which the second output voltage out2 is supplied and the output terminal N1 of the pump circuit 131 in response to the turn-off voltage.

The third switch 34 outputs the turn-on voltage or the turn-off voltage of a high voltage in response to a third switch enable signal SWEN3. The third switching circuit S3 is formed of an NMOS transistor for transferring the third output voltage out3 to the output terminal N1 of the pump circuit 131 in response to the turn-on voltage of the third switch 34 or for blocking a voltage transfer between a node to which the third output voltage out3 is supplied and the output terminal N1 of the pump circuit 131 in response to the turn-off voltage.

The fourth switch 44 outputs the turn-on voltage or the turn-off voltage of a high voltage in response to a fourth switch enable signal SWEN4. The fourth switching circuit S4 is formed of an NMOS transistor for transferring the fourth output voltage out4 to the output terminal N1 of the pump circuit 131 in response to the turn-on voltage of the fourth switch 44 or for blocking a voltage transfer between a node to which the fourth output voltage out4 is supplied and the output terminal N1 of the pump circuit 131 in response to the turn-off voltage.

The division circuit 50 includes a first resistor R1 and a second resistor R2 which are coupled in series between a ground terminal and the output terminal N1 of the pump circuit 131. In particular, the first resistor R1 is a variable resistor having a resistance varied in response to control signals I<#> which are activated in response to the control bit CONB of the control circuit 120. The division circuit 50 outputs the division voltage $V_{DI}$ to a second node N2 by dividing voltage, supplied to the output terminal N1 of the pump circuit 131, based on the varied resistance.

The comparison circuit 60 outputs the clock enable signal CLOCKEN by comparing a reference voltage $V_{REF}$ with the division voltage $V_{DI}$ of the division circuit 50. The division voltage $V_{DI}$ is supplied to the input terminal – of the comparison circuit 60, and the reference voltage $V_{REF}$ is supplied to the input terminal + of the comparison circuit 60. Accordingly, when the reference voltage $V_{REF}$ is higher than the division voltage $V_{DI}$, the comparison circuit 60 outputs the clock enable signal CLOCKEN of a high so that selected high voltage generation circuits can perform the pumping operations. When the division voltage $V_{DI}$ is higher than the reference voltage $V_{REF}$, the comparison circuit 60 outputs the clock enable signal CLOCKEN of a low so that selected high voltage generation circuits do not perform the pumping operations.

The division circuit 50 is described in detail below.

FIG. 3 is a detailed circuit diagram of the division circuit 50 shown in FIG. 2.

Referring to FIG. 3, the first resistor R1 includes a plurality of resistors, coupled in series between the second node N2 and the output terminal N1 of the pump circuit 131, and a plurality of switches TR0 to TR15 coupled between the second node N2 and respective nodes between the resistors and operated in response to the respective control signals I<#>. The switches TR0 to TR15 may be formed of NMOS transistors. Although the 16 switches TR0 to TR15 are illustrated in FIG. 3, for the purpose of description, the number of switches and resistors may be changed according to the embodiments.

The control signals I<0> to I<15> are determined in response to the control bit CONB of the control circuit 120. The first to fourth pump-off signals PUMP OFF1 to PUMP OFF4 shown in FIG. 2 are determined in response to the control signals I<0> to I<15>. Table 1 below shows a method of determining the first to fourth pump-off signals PUMP OFF1 to PUMP OFF4.

TABLE 1

| CONB | I# | PUMP OFF# | Pump used |
| --- | --- | --- | --- |
| 0000 | I<0> | PUMP OFF1: off | 13 of FIG. 2 |
| 0001 | I<1> | PUMP OFF2: on | |
| 0010 | I<2> | PUMP OFF3: on | |
| 0011 | I<3> | PUMP OFF4: on | |

TABLE 1-continued

| CONB | I# | PUMP OFF# | Pump used |
| --- | --- | --- | --- |
| 0100 | I<4> | PUMP OFF1: off | 13 and 23 of FIG. 2 |
| 0101 | I<5> | PUMP OFF2: off | |
| 0110 | I<6> | PUMP OFF3: on | |
| 0111 | I<7> | PUMP OFF4: on | |
| 1000 | I<8> | PUMP OFF1: off | 13, 23, and 33 of FIG. 2 |
| 1001 | I<9> | PUMP OFF2: off | |
| 1010 | I<10> | PUMP OFF3: off | |
| 1011 | I<11> | PUMP OFF4: on | |
| 1100 | I<12> | PUMP OFF1: off | 13, 23, 33, and 43 of FIG. 2 |
| 1101 | I<13> | PUMP OFF2: off | |
| 1110 | I<14> | PUMP OFF3: off | |
| 1111 | I<15> | PUMP OFF4: off | |

As shown in Table 1, the control signals <I#> are generated in response to the control bit CONB, and the first to fourth pump-off signals PUMP OFF1 to PUMP OFF4 can be determined in response to the control signals <I#>. In other words, when the control bit CONB is 0000, the control signal I<0> is activated. When the control bit CONB is 0010, the control signal I<2> is activated. Likewise, the control signals I<0> to I<15> are activated or deactivated, and thus the first to fourth pump-off signals PUMP OFF1 to PUMP OFF4 are determined.

A method of operating the pump circuit 131 is described in detail below.

FIG. 4 is a timing diagram illustrating a method of driving the pump circuit 131 of FIG. 2.

Referring to FIGS. 4 and 2, the first high voltage generation circuit 10 raises the level of the power source voltage VDD. The second high voltage generation circuit 20 further raises the voltage raised by the first high voltage generation circuit 10. The third high voltage generation circuit 30 further raises the voltage raised by the second high voltage generation circuit 20. The fourth high voltage generation circuit 40 further raises the voltage raised by the third high voltage generation circuit 30. Accordingly, when voltage outputted from the first high voltage generation circuit 10 is used, the remaining second to fourth high voltage generation circuits 20, 30, and 40 are not driven so that current consumption can be reduced.

Furthermore, when voltage outputted from the second high voltage generation circuit 20 is used, the first and the second high voltage generation circuits 10 and 20 are driven because the first output voltage out1 of the first high voltage generation circuit 10 is used, but the remaining high voltage generation circuits 30 and 40 which are not used are not driven. In other words, when N high voltage generation circuits are included in the pump circuit 131 and an $(N/2)^{th}$ high voltage generation circuit of the N high voltage generation circuits has been selected, the first high voltage generation circuit to the $(N/2)^{th}$ high voltage generation circuit are driven, but the $((N/2)+1)^{th}$ high voltage generation circuit to the $N^{th}$ high voltage generation circuit are not driven.

The above operation is described in detail below with reference to the timing diagram of FIG. 4.

All the first to fourth pump-off signals PUMP OFF1 to PUMP OFF4 remain high, and then only the first pump-off signal PUMP OFF1 shifts to a low at a point of time T1 when a first pump voltage output section starts. When the first pump-off signal PUMP OFF1 shifts to a low, the first clock control circuit 11 outputs the clock signal pulsed between a high and a low in response to the clock Clock, and the first clock driver 12 outputs signals of a high and a low in response to the clock signal of the first clock control circuit 11.

The first charge pump 13 raises the level of the power source voltage VDD by performing the pumping operation in response to the output signal of the first clock driver 12 and outputs the first output voltage out1. When the first switch enable signal SWEN1 shift to a high, the first output voltage out1 is transferred to the output terminal N1, so that the output voltage OUT having a first level is outputted.

The second to fourth high voltage generation circuits 20, 30, and 40 are not driven because the second to fourth pump-off signals PUMP OFF2 to PUMP OFF4 remain high until the output voltage OUT of the first level is outputted.

At a point of time T2 for outputting the output voltage OUT having a second level higher than the first level, the second pump-off signal PUMP OFF2 shifts to a low. At this time, the first pump-off signal PUMP OFF1 remains low. Since both the first and the second pump-off signal PUMP OFF1 and PUMP OFF2 are low, the second output voltage out2 is outputted by the first and the second high voltage generation circuits 10 and 20.

At a point of time T3, when the second switch enable signal SWEN2 shifts to a high, the output voltage OUT having the second level is outputted from the output terminal N1. At this time, although the point of time T2 and the point of time T3 may be synchronized at the same time, it is preferred that the second output voltage out2 be generated first and transferred to the output terminal N1 in order to stably output the output voltage OUT.

At a point of time T4 for outputting the output voltage OUT having a third level higher than the second level, the third pump-off signal PUMP OFF3 shifts to a low. At this time, the first and the second pump-off signal PUMP OFF1 and PUMP OFF2 remain low. Since the first to third pump-off signals PUMP OFF1 to PUMP OFF3 are low, the third output voltage out3 is outputted by the first to third high voltage generation circuits 10, 20, and 30.

At a point of time T5, when the third switch enable signal SWEN3 shifts to a high, the output voltage OUT having the third level is outputted from the output terminal N1. At this time, although the point of time T4 and the point of time T5 may be synchronized at the same time, it is preferred that the third output voltage out3 be generated first and transferred to the output terminal N1 in order to stably output the output voltage OUT.

At a point of time T6 for outputting the output voltage OUT having a fourth level higher than the third level, the fourth pump-off signal PUMP OFF4 shifts to a low. At this time, the first to third pump-off signals PUMP OFF1 to PUMP OFF3 remain low. Since the first to fourth pump-off signals PUMP OFF1 to PUMP OFF4 are low, the fourth output voltage out4 is outputted by the first to fourth high voltage generation circuits 10, 20, 30, and 40.

At a point of time T7, when the fourth switch enable signal SWEN4 shifts to a high, the output voltage OUT having the fourth level is outputted from the output terminal N1. At this time, the point of time T6 and the point of time T7 may be synchronized at the same time, it is preferred that the fourth output voltage out4 be generated first and transferred to the output terminal N1 in order to stably output the output voltage OUT.

In each of the pump voltage output sections, the output voltage OUT is divided by the first and the second resistors R1 and R2. The output voltage OUT is determined in accordance with Equation 1 below.

$$\text{OUT} = \left(1 + \frac{R1}{R2}\right) V_{REF} \quad \text{[Equation 1]}$$

In Equation 1, OUT is a level (V) of the output voltage OUT of the pump circuit 131, R1 is a resistance value (Ω) of the first resistor R1, R2 is a resistance value (Ω) of the second resistor R2, and $V_{REF}$ is the reference voltage (V).

Signals when the output voltages OUT having various levels are outputted according to Equation 1 are listed in Table 2. In Table 2, as an example, it is described that the total number of the stages of the pump circuit 131 is five, the first charge pump 13 includes two stages, and each of the second to fourth charge pumps 23, 33, and 43 includes one stage is described. Furthermore, numbers shown in Table 1 are for illustration only and may be changed according to various operations.

TABLE 2

| R1 (Ω) | Voltage level (V) | Stage (maximum output level) | PUMP OFF# | SWEN# | OUT |
|---|---|---|---|---|---|
| 1 | 2 | 2 (5 V) | PUMP OFF1: Low PUMP OFF2, 3, 4: High | SWEN1: ON SWEN2, 3, 4: OFF | out1 |
| 2 | 3 | 2 (5 V) | PUMP OFF1: Low PUMP OFF2, 3, 4: High | SWEN1: ON SWEN2, 3, 4: OFF | out1 |
| 3 | 4 | 2 (5 V) | PUMP OFF1: Low PUMP OFF2, 3, 4: High | SWEN1: ON SWEN2, 3, 4: OFF | out1 |
| 4 | 5 | 3 (7.5 V) | PUMP OFF1, 2: Low PUMP OFF3, 4: High | SWEN2: ON SWEN1, 3, 4: OFF | Out2 |
| 5 | 6 | 3 (7.5 V) | PUMP OFF1, 2: Low PUMP OFF3, 4: High | SWEN2: ON SWEN1, 3, 4: OFF | Out2 |
| 6 | 7 | 4 (10 V) | PUMP OFF1, 2, 3: Low PUMP OFF4: High | SWEN3: ON SWEN1, 2, 4: OFF | Out3 |
| 7 | 8 | 4 (10 V) | PUMP OFF1, 2, 3: Low PUMP OFF4: High | SWEN3: ON SWEN1, 2, 4: OFF | Out3 |
| 8 | 9 | 5 (12.5 V) | PUMP OFF1, 2, 3, 4: Low | SWEN4: ON SWEN1, 2, 3: OFF | Out4 |
| 9 | 10 | 5 (12.5 V) | PUMP OFF1, 2, 3, 4: Low | SWEN4: ON SWEN1, 2, 3: OFF | Out4 |

Referring to Table 2, when the first resistor R1 is set to 1Ω, only the first pump-off signal PUMP OFF1 becomes low, and the remaining second to fourth pump-off signals PUMP OFF2 to PUMP OFF4 become high. Accordingly, only first high voltage generation circuit 10 including the two stages performs a pumping operation, and the remaining second to fourth high voltage generation circuits 20, 30, and 40 do not perform a pumping operation.

In this case, the output voltage OUT, as voltage corresponding to the first output voltage out1, has a level which is determined depending on the resistances and the reference voltage (refer to Equation 1). Furthermore, since a maximum output level that may be outputted using the two stages is 5 V as shown in Table 2, the output voltage OUT may be stably outputted even when the target voltage level is 2 V to 4 V. A maximum output level of each of the first to fourth high voltage generation circuits 10, 20, 30, and 40 may be determined by the number of stages, for example, calculated by multiplying the number of stages by 2.5.

When the first resistor R1 is set to 7Ω, the first to third pump-off signals PUMP OFF1 to PUMP OFF3 become low, and the remaining fourth pump-off signal PUMP OFF4 becomes high. Accordingly, the first high voltage generation circuit 10 including two stages and the second and the third high voltage generation circuits 20 and 30, each including one stage, perform pumping operations, and the remaining fourth high voltage generation circuit 40 does not perform a pumping operation. In other words, the pumping operation is performed using the four stages.

In this case, the output voltage OUT, as voltage corresponding to the third output voltage out3, has a level which is determined depending on the resistances and the reference voltage (refer to Equation 1). Furthermore, since a maximum output level that may be outputted using the four stages is 10 V as shown in Table 2, the output voltage OUT may be stably outputted even when the target level has 8 V or less.

As described above, according to this disclosure, the output voltage OUT is outputted by selectively driving the charge pumps. Accordingly, power consumption may be reduced.

Furthermore, the plurality of charge pumps included in the pump circuit is selectively operated. Accordingly, power consumption may be reduced, and power consumption may be prevented from increasing in excess, in particular, when a low voltage is outputted.

What is claimed is:

1. A pump circuit, comprising:
a plurality of clock control circuits configured to transfer a clock to respective output terminals in response to respective pump-off signals or block the clock from being transferred to the respective output terminals;
a plurality of charge pumps configured to generate respective high voltages by performing respective pumping operations in response to respective clock signals of the output terminals; and
a plurality of switching circuits configured to transfer the respective high voltages to a final output terminal in response to respective control signals,
wherein each of the charge pumps receives a high voltage generated from a preceding charge pump as a previous high voltage to output a corresponding high voltage by performing the pumping operation on the previous high voltage.

2. The pump circuit of claim 1, further comprising:
a division circuit configured to divide an output voltage of the final output terminal; and
a comparison circuit configured to generate a clock enable signal by comparing the divided voltage with a reference voltage, wherein the clock control circuits are configured to transfer the clock to the respective output terminals or block the clock from being transferred to the respective output terminals in response to the clock enable signal.

3. The pump circuit of claim 2, wherein the division circuit comprises a plurality of resistors.

4. The pump circuit of claim 1, wherein each of the clock control circuits comprises a NAND gate.

5. The pump circuit of claim 1, wherein:
a first charge pump of the charge pumps is configured to generate a first high voltage by pumping a power supply voltage in response to a first clock signal, and an Nth charge pump of the charge pumps other than the first charge pump is configured to generate an Nth high voltage by pumping an N−1th high voltage, outputted from an N−1th charge pump, in response to an Nth clock signal.

6. The pump circuit of claim 5, wherein the charge pumps are sequentially activated to generate the respective high voltages and the high voltage of the charge pump activated last is transferred to the final output terminal.

7. The pump circuit of claim 6, wherein the switching circuits are sequentially and alternately activated to transfer the respective high voltages while the charge pumps are sequentially activated to be maintained.

8. The pump circuit of claim 1, wherein each of the switching circuits comprises an NMOS transistor.

9. A semiconductor memory device, comprising:
a memory cell array configured to store data;
a plurality of clock control circuits configured to output respective clocks to respective output terminals in response to respective pump-off signals;
a plurality of high voltage generators configured to generate respective high voltages in response to the respective clocks;
a plurality of switching circuits configured to transfer the respective high voltages to a final output terminal in response to respective control signals;
a row decoder configured to transfer the high voltages, transferred to the final output terminal, to the memory cell array; and
a control circuit configured to output the pump-off signals, wherein the pump-off signals are activated in response to a set high voltage level,
wherein each of the high voltage generators receives a high voltage generated from a preceding high voltage generator as a previous high voltage to output a corresponding high voltage by performing the pumping operation on the previous high voltage.

10. The semiconductor memory device of claim 9, wherein each of the switching circuits comprises an NMOS transistor.

11. The semiconductor memory device of claim 9, further comprising:
a division circuit configured to divide an output voltage of the final output terminal; and
a comparison circuit configured to generate a clock enable signal by comparing the divided voltage with a reference voltage, wherein the clock control circuits are configured to transfer the clock to the respective output terminals or block the clock from being transferring to the respective output terminals in response to the clock enable signal.

12. The semiconductor memory device of claim 11, wherein the division circuit comprises a plurality of resistors.

13. The semiconductor memory device of claim 9, wherein each of the clock control circuits comprises a NAND gate.

14. The semiconductor memory device of claim 9, wherein:
the high voltage generators comprise respective charge pumps coupled in parallel, a first charge pump of the plurality of charge pumps configured to generate a first high voltage by pumping a power supply voltage in response to a first clock, and an Nth charge pump of the charge pumps other than the first charge pump is configured to generate an Nth high voltage by pumping an N−1th high voltage, outputted from an N−1th charge pump, in response to an Nth clock.

15. The semiconductor memory device of claim 14, wherein the charge pumps are sequentially activated to generate the respective high voltages and the high voltage of the charge pump activated last is transferred to the final output terminal.

16. A pump circuit, comprising:
a plurality of high voltage generation circuits configured to generate respective high voltages by performing respective pumping operations in response to a clock; and
a plurality of switching circuits configured to transfer the respective high voltages to a final output terminal in response to respective control signals, wherein each of the high voltage generation circuits comprises a clock control circuit for supplying a clock to the high voltage generation circuit in response to a pump-off signal or for blocking the clock from being supplied to the high voltage generation circuit,
wherein each of the high voltage generation circuits receives a high voltage generated from a preceding high voltage generation circuit as a previous high voltage to output a corresponding high voltage by performing the pumping operation on the previous high voltage.

17. The pump circuit of claim 16, wherein each of the high voltage generation circuits comprises a charge pump.

18. The pump circuit of claim 16, wherein the clock control circuit comprises a NAND gate.

19. The pump circuit of claim 16, further comprising:
a division circuit configured to divide the high voltage supplied to the output terminal; and
a comparison circuit configured to generate a clock enable signal by comparing the divided voltage with a reference voltage, wherein the clock control circuit is configured to transfer the clock to the high voltage generation circuit or block the clock from being supplied to the high voltage generation circuit in response to the clock enable signal.

20. The pump circuit of claim 19, wherein the division circuit comprises a plurality of resistors.

* * * * *